United States Patent
Schwarz et al.

(10) Patent No.: US 9,837,591 B2
(45) Date of Patent: Dec. 5, 2017

(54) LIGHT-EMITTING SEMICONDUCTOR COMPONENT AND METHOD OF PRODUCING LIGHT-EMITTING SEMICONDUCTOR COMPONENTS

(71) Applicant: OSRAM Opto Semiconductors GmbH, Regensburg (DE)

(72) Inventors: Thomas Schwarz, Regensburg (DE); Frank Singer, Regenstauf (DE); Alexander Linkov, Regensburg (DE); Stefan Illek, Donaustauf (DE); Wolfgang Mönch, Pentling (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/888,770

(22) PCT Filed: May 5, 2014

(86) PCT No.: PCT/EP2014/059079
§ 371 (c)(1),
(2) Date: Nov. 3, 2015

(87) PCT Pub. No.: WO2014/180772
PCT Pub. Date: Nov. 13, 2014

(65) Prior Publication Data
US 2016/0087177 A1   Mar. 24, 2016

(30) Foreign Application Priority Data

May 10, 2013 (DE) .................. 10 2013 104 840

(51) Int. Cl.
*H01L 33/60* (2010.01)
*H01L 33/58* (2010.01)
(Continued)

(52) U.S. Cl.
CPC .............. *H01L 33/62* (2013.01); *H01L 24/24* (2013.01); *H01L 33/0095* (2013.01);
(Continued)

(58) Field of Classification Search
CPC ....... H01L 33/60; H01L 33/58; H01L 33/486; H01L 33/483; H01L 33/54; H01L 33/62;
(Continued)

(56) References Cited

U.S. PATENT DOCUMENTS

| 7,538,359 B2 * | 5/2009 | Eng ...................... G02B 6/0021 257/98 |
| 7,589,354 B2 * | 9/2009 | Lin ......................... H01L 33/60 257/98 |

(Continued)

FOREIGN PATENT DOCUMENTS

| DE | 10 2009 051 748 A1 | 5/2011 |
| DE | 10 2010 032 041 A1 | 1/2012 |

(Continued)

OTHER PUBLICATIONS

"Cuw Yash—Micro SIDELED 4206", Datasheet, Draft Version a.1, OSRAM Opto Semiconductors GmbH, Mar. 18, 2013, pp. 1-23.
(Continued)

*Primary Examiner* — Marvin Payen
*Assistant Examiner* — Jeremy Joy
(74) *Attorney, Agent, or Firm* — DLA Piper LLP (US)

(57) ABSTRACT

A radiation-emitting semiconductor device includes at least one semiconductor chip having a semiconductor layer sequence having an active region that produces radiation; a mounting surface on which at least one electrical contact for external contacting of the semiconductor chip is formed, wherein the mounting surface runs parallel to a main extension plane of the semiconductor layer sequence; a radiation exit surface running at an angle to or perpendicularly to the
(Continued)

mounting surface; a radiation-guiding layer arranged in a beam path between the semiconductor chip and the radiation exit surface; and a reflector body adjacent to the radiation-guiding layer in regions and in a top view of the semiconductor device covers the semiconductor chip.

9 Claims, 11 Drawing Sheets

(51) Int. Cl.
    *H01L 33/48* (2010.01)
    *H01L 33/62* (2010.01)
    *H01L 33/54* (2010.01)
    *H01L 33/46* (2010.01)
    *H01L 23/00* (2006.01)
    *H01L 33/00* (2010.01)
    *H01L 25/075* (2006.01)

(52) U.S. Cl.
    CPC ............ *H01L 33/46* (2013.01); *H01L 33/486* (2013.01); *H01L 33/54* (2013.01); *H01L 33/58* (2013.01); *H01L 33/60* (2013.01); *H01L 25/0753* (2013.01); *H01L 2224/32245* (2013.01); *H01L 2224/48091* (2013.01); *H01L 2224/48137* (2013.01); *H01L 2224/48247* (2013.01); *H01L 2224/48471* (2013.01); *H01L 2224/48479* (2013.01); *H01L 2224/49107* (2013.01); *H01L 2224/73265* (2013.01); *H01L 2924/12035* (2013.01); *H01L 2924/12041* (2013.01); *H01L 2933/0058* (2013.01); *H01L 2933/0066* (2013.01)

(58) Field of Classification Search
    CPC ......... H01L 25/0753; H01L 2933/0091; H01L 33/46
    See application file for complete search history.

(56) References Cited

U.S. PATENT DOCUMENTS

| | | | | |
|---|---|---|---|---|
| 9,455,385 | B2* | 9/2016 | Park | H01L 33/60 |
| 2002/0063301 | A1 | 5/2002 | Hanamoto et al. | |
| 2002/0123163 | A1* | 9/2002 | Fujii | H01L 33/486 |
| | | | | 438/26 |
| 2004/0028095 | A1* | 2/2004 | Ishida | H01S 5/02252 |
| | | | | 372/36 |
| 2004/0061440 | A1* | 4/2004 | Imai | G02B 6/0028 |
| | | | | 313/512 |
| 2004/0169187 | A1 | 9/2004 | Fujii | |
| 2005/0133796 | A1* | 6/2005 | Seo | H01L 33/46 |
| | | | | 257/79 |
| 2005/0167682 | A1* | 8/2005 | Fukasawa | H01L 33/60 |
| | | | | 257/79 |
| 2005/0219835 | A1 | 10/2005 | Nagayama | |
| 2006/0186431 | A1 | 8/2006 | Miki et al. | |
| 2006/0262554 | A1* | 11/2006 | Mok | G02B 6/0031 |
| | | | | 362/555 |
| 2007/0284600 | A1* | 12/2007 | Shchekin | H01L 33/46 |
| | | | | 257/98 |
| 2008/0165539 | A1* | 7/2008 | Hsu | H01L 33/60 |
| | | | | 362/309 |
| 2008/0210966 | A1* | 9/2008 | Sakamoto | H01L 33/46 |
| | | | | 257/98 |
| 2008/0290359 | A1* | 11/2008 | Inoue | B29C 39/42 |
| | | | | 257/98 |
| 2008/0291691 | A1* | 11/2008 | Ishizaka | H01L 33/486 |
| | | | | 362/555 |
| 2008/0308824 | A1* | 12/2008 | Shchekin | G02B 6/0073 |
| | | | | 257/98 |
| 2009/0108283 | A1 | 4/2009 | Kadotani et al. | |
| 2010/0193822 | A1* | 8/2010 | Inobe | H01L 33/54 |
| | | | | 257/98 |
| 2010/0213487 | A1* | 8/2010 | Kuo | H01L 21/561 |
| | | | | 257/98 |
| 2010/0238687 | A1* | 9/2010 | Odawara | H01L 33/483 |
| | | | | 362/612 |
| 2011/0062470 | A1* | 3/2011 | Bierhuizen | H01L 33/54 |
| | | | | 257/98 |
| 2012/0018759 | A1 | 1/2012 | Ohta | |
| 2013/0015483 | A1 | 1/2013 | Shimokawa et al. | |
| 2013/0126926 | A1* | 5/2013 | Sakai | H01L 33/005 |
| | | | | 257/98 |
| 2013/0207139 | A1* | 8/2013 | Weidner | H01L 33/20 |
| | | | | 257/91 |
| 2014/0070259 | A1* | 3/2014 | Yoon | H01L 33/62 |
| | | | | 257/99 |

FOREIGN PATENT DOCUMENTS

| | | |
|---|---|---|
| EP | 1 204 151 A1 | 5/2002 |
| JP | 50-92182 | 8/1975 |
| JP | 57-5356 | 1/1982 |
| JP | 2002-344030 | 11/2002 |
| JP | 2006-229055 | 8/2006 |
| JP | 2007-059612 A | 3/2007 |
| JP | 2009-224376 | 10/2009 |
| JP | 2010-225754 | 10/2010 |
| JP | 2010-225755 | 10/2010 |
| JP | 2013-21175 | 1/2013 |
| JP | 2013-258175 | 12/2013 |
| TW | 200951202 A | 12/2009 |
| TW | 201214793 | 4/2012 |
| TW | 201220545 A | 5/2012 |

OTHER PUBLICATIONS

Notification for the Opinion of Re-Examination Report dated Dec. 19, 2016, of corresponding Taiwanese Application No. 103115790 in English.
English translation of the Final Notification of Reasons for Refusal dated Apr. 3, 2017, of corresponding Japanese Application No. 2016-512314.
Notification of the First Office Action dated Mar. 1, 2017, of corresponding Chinese Application No. 201480026324.0 in English.

* cited by examiner

LIGHT-EMITTING SEMICONDUCTOR COMPONENT AND METHOD OF PRODUCING LIGHT-EMITTING SEMICONDUCTOR COMPONENTS

TECHNICAL FIELD

This disclosure relates to a radiation-emitting semiconductor component and a method of producing radiation-emitting semiconductor components.

BACKGROUND

In hand-held electronic apparatuses such as, for example, mobile communications apparatuses, liquid crystals displays for the back-lighting of which LEDs can also be employed are often used. With the progressive reduction of the installation depth of such apparatuses, however, the demands on the installation height of the LEDs are also increasing to the extent that these can no longer be readily achieved with conventional designs.

It could therefore be helpful to provide a radiation-emitting semiconductor component which, with a low installation height, provides a luminous flux sufficient to use the apparatus and a method with which such radiation-emitting semiconductor components can be produced simply and inexpensively.

SUMMARY

We provide a radiation-emitting semiconductor device including at least one semiconductor chip having a semiconductor layer sequence having an active region that produces radiation; a mounting surface on which at least one electrical contact for external contacting of the semiconductor chip is formed, wherein the mounting surface runs parallel to a main extension plane of the semiconductor layer sequence; a radiation exit surface running at an angle to or perpendicularly to the mounting surface; a radiation-guiding layer arranged in a beam path between the semiconductor chip and the radiation exit surface; and a reflector body adjacent to the radiation-guiding layer in regions and in a top view of the semiconductor device covers the semiconductor chip.

We further provide a method of producing a plurality of radiation-emitting semiconductor devices including:
a) providing a plurality of semiconductor chips which each have a semiconductor layer sequence having an active region that produces radiation;
b) forming a radiation-guiding layer adjacent to the semiconductor chips;
c) molding a reflector material around the radiation-guiding layer at least in regions to form a reflector body; and
d) singulating into the radiation-emitting semiconductor devices, wherein each semiconductor device has at least one semiconductor chip, and during singulation, the radiation-guiding layer and the reflector body are severed such that the radiation-guiding layer forms a radiation exit surface of the singulated semiconductor devices.

We yet further provide a radiation-emitting semiconductor device including at least one semiconductor chip having a semiconductor layer sequence having an active region that produces radiation; a mounting surface on which at least one electrical contact for external contacting of the semiconductor chip is formed, wherein the mounting surface runs parallel to a main extension plane of the semiconductor layer sequence; a radiation exit surface running at an angle to or perpendicularly to the mounting surface; a radiation-guiding layer arranged in a beam path between the semiconductor chip and the radiation exit surface; and a reflector body adjacent to the radiation-guiding layer in regions and in a top view of the semiconductor device covers the semiconductor chip, wherein the reflector body forms the mounting surface in regions.

DETAILED DESCRIPTION

Figure 1A:
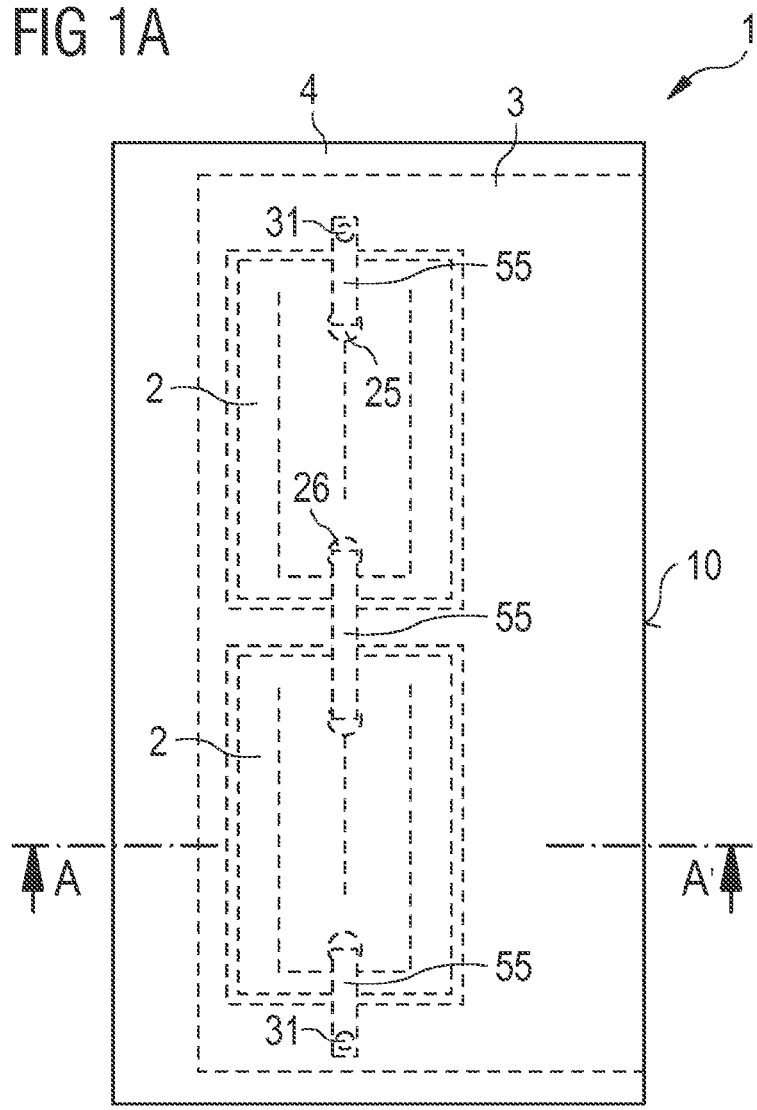
FIGS. 1A to 1D show an example of a semiconductor component in a top view diagram (FIG. 1A), section view diagram (FIG. 1B) and in two perspective views in FIGS. 1C and 1D.
Figure 1B:
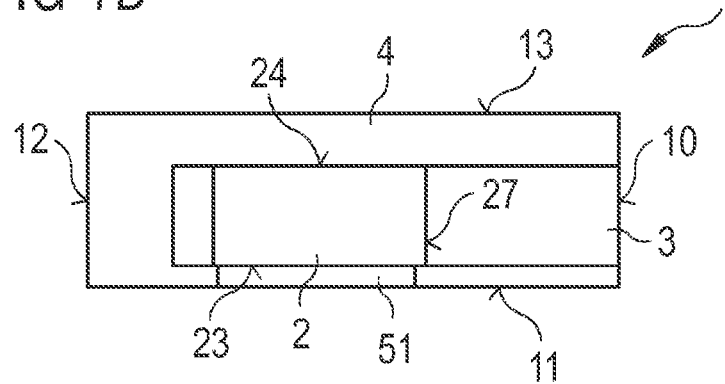
Figure 1C:
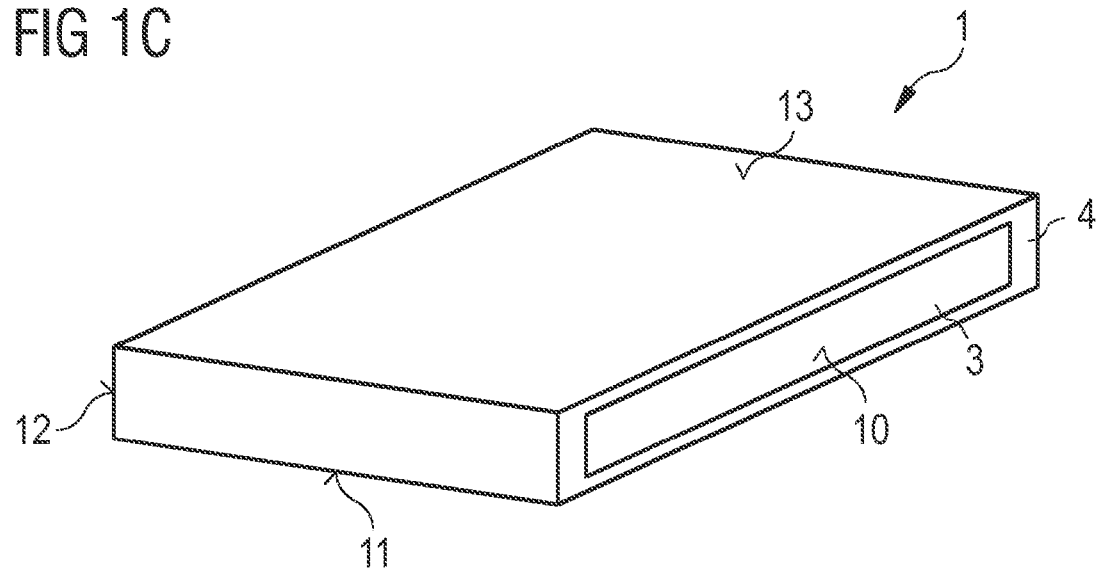
Figure 1D:
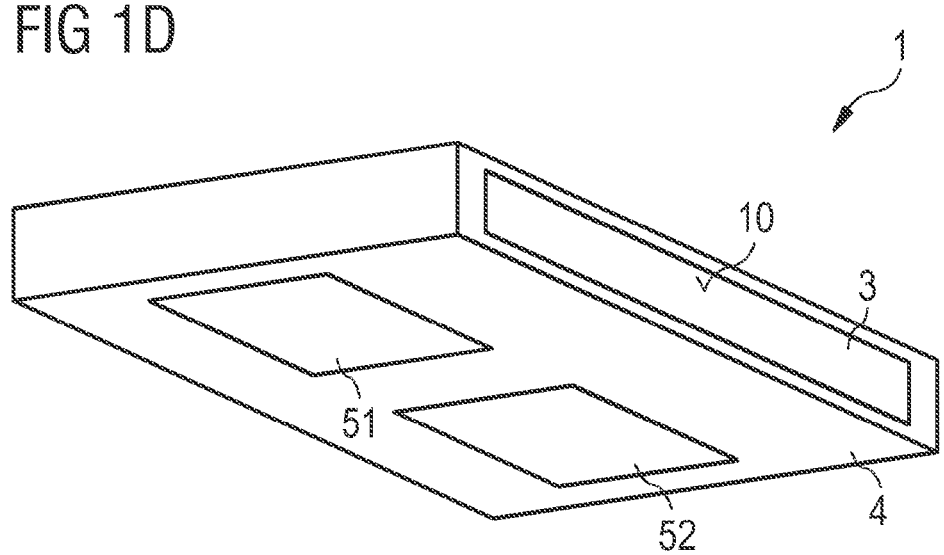

Our radiation-emitting semiconductor component may have at least one semiconductor chip having a semiconductor layer sequence. The semiconductor layer sequence has an active region to produce radiation. The active region in particular produces radiation in the visible, ultraviolet or infrared spectral range. The semiconductor layer sequence has, for example, a first semiconductor layer of a first conduction type and a second semiconductor layer of a second conduction type which differs from the first conduction type. The active region is arranged between the first semiconductor layer and the second semiconductor layer. The semiconductor chip expediently has a first connection land and a second connection land for electrical contact.

The semiconductor component may have a mounting surface on which at least one electrical contact for the external electrical contacting of the semiconductor chip is formed. The mounting surface runs in particular parallel to the main extension plane of the semiconductor layers of the semiconductor layer sequence. The term "parallel" also includes relative arrangements of mounting surface and main extension plane of the semiconductor layer sequence in which the mounting surface and the main extension plane enclose a small production-related angle, for example, an angle of at most 10°. In the vertical direction the semiconductor component extends between the mounting surface and a front side of the semiconductor component. A vertical direction means a direction running perpendicularly to the mounting surface. Correspondingly, a lateral direction means a direction which runs parallel to the mounting surface.

In particular, a first electrical contact and a second electrical contact are formed on the mounting surface.

The semiconductor component may have a radiation exit surface running at an angle to or perpendicularly to the mounting surface. For example, the radiation exit surface encloses an angle with the mounting surface of 60° to 120°, in particular 85° to 95°. The radiation exit surface is formed on a side face of the semiconductor component delimiting the semiconductor component in the lateral direction. The radiation exit surface is, in particular, spaced from the semiconductor chip in the lateral direction. In particular, the semiconductor component has exactly one radiation exit surface. In other words, the remaining side faces of the semiconductor component and the front side of the semiconductor component are free from a radiation exit surface. A main radiating direction of the radiation-emitting semiconductor component runs in particular parallel to the mounting surface.

The semiconductor component may have a radiation-guiding layer. The radiation-guiding layer is arranged in particular in the beam path between the semiconductor chip and the radiation exit surface. The radiation-guiding layer is transparent or at least translucent for the radiation produced in the active region of the semiconductor chip. In particular, the radiation-guiding layer extends uninterruptedly from the semiconductor chip to the radiation exit surface. That is to say, the radiation-guiding layer is adjacent to the semiconductor chip and forms the radiation exit surface. The radiation-guiding layer thus forms the side face of the semiconductor component in regions.

The semiconductor component may have a reflector body. The reflector body is adjacent in particular to the radiation-guiding layer in regions. The reflector body reflects back into the radiation-guiding layer radiation guided in the radiation-guiding layer and running in the direction of the reflector body. The reflector body can be formed to reflect diffusely and/or reflect directionally. For example, the reflector body comprises a plastic to which particles which increase reflectivity are added. For example, a polymer material, for example, a silicone is suitable for the reflector body. Titanium oxide, for example, is suitable for the particles.

In a top view of the semiconductor component the reflector body covers the semiconductor chip at least in regions, preferably completely. With the reflector body the situation is avoided where radiation exiting through the front side of the semiconductor chip exits from the radiation-emitting semiconductor component in the vertical direction. In particular, the radiation can be reflected back into the radiation-guiding layer and subsequently exit through the lateral radiation exit surface.

The semiconductor component may have at least one semiconductor chip having a semiconductor layer sequence having an active region to produce radiation. The radiation-emitting semiconductor component comprises a mounting surface on which at least one electrical contact for external contacting of the semiconductor chip is formed, wherein the mounting surface runs parallel to a main extension plane of the semiconductor layer sequence. A radiation exit surface runs at an angle to or perpendicularly to the mounting surface. The radiation-emitting semiconductor component furthermore comprises a radiation-guiding layer arranged in the beam path between the semiconductor chip and the radiation exit surface. Furthermore, the radiation-emitting semiconductor component comprises a reflector body adjacent to the radiation-guiding layer in regions and in a top view of the semiconductor component covers the semiconductor chip.

With the radiation-guiding layer and the reflector body a semiconductor component which can be distinguished by a particularly low installation height and during operation emits radiation through a, in particular only through exactly one, lateral radiation exit surface is realized in a simple manner.

Compared to conventional laterally emitting semiconductor components in which the semiconductor chips are positioned in prefabricated housings, the semiconductor components are moreover distinguished by an improved removal of heat. Furthermore, the semiconductor components can be produced particularly inexpensively at the wafer level.

The radiation-emitting semiconductor component is formed in particular as a surface mounted component (SMD).

The radiation-guiding layer may comprise a radiation-converting material. The radiation-converting material converts primary radiation produced in the semiconductor chip, in particular in the active region, and having a first peak wavelength at least partially into secondary radiation having a second peak wavelength differing from the first peak wavelength. The radiation-converting material can completely or only partially convert the primary radiation produced in the semiconductor chip. The semiconductor component emits, for example, mixed light, in particular light appearing white to the human eye. For example, the radiation radiated in total from the semiconductor component comprises radiation contents in the red, green and blue spectral range. Such a semiconductor component is particularly suitable for back-lighting a display apparatus, for example, a liquid crystal display.

The radiation-guiding layer may form the radiation exit surface. In a side view, the reflector body runs around the radiation exit surface along the entire circumference. The reflector body thus delimits the radiation exit surface and prevents an exit of radiation laterally to the radiation exit surface.

The semiconductor chip may connect to the contact by a contact track. For example, the contact track is arranged between the radiation-guiding layer and the reflector layer in regions. The contact track can be adjacent, in particular, both to the radiation-guiding layer and the reflector layer in regions. The contact track is formed, for example, as a coating applied to the radiation-guiding layer. Alternatively, the contact track can be formed, for example, by a wire bond connection.

The radiation-guiding layer may run completely around the semiconductor chip in a top view of the semiconductor component, in particular at the level of the active region. In particular, the side faces of the semiconductor chip are covered completely with the radiation-guiding layer. For example, the radiation-guiding layer is formed on to the semiconductor chip.

The radiation-guiding layer may be arranged in the lateral direction between the semiconductor chip and the radiation exit surface. Radiation exiting from the semiconductor chip in the lateral direction is thus coupled directly into the radiation-guiding layer. In the vertical direction the radiation exit surface is at the same level as the semiconductor chip.

In a top view of the semiconductor component, the front side of the semiconductor chip may be free from the radiation-guiding layer. In particular, seen from the mounting surface, the radiation-guiding layer does not extend or extends only slightly in the vertical direction, that is to say by at most 10% of the maximum vertical extension, beyond the semiconductor chip. The radiation-guiding layer thus does not have the effect of widening the radiated radiation in the vertical direction. Coupling into flat light guides is thereby simplified.

The radiation-guiding layer may have at least one opening through which the semiconductor chip connects electrically conductively to the contact. The opening extends in particular in the vertical direction completely through the radiation-guiding layer. In particular, the opening is arranged outside the direct beam path between the semiconductor chip and the radiation exit surface. Radiation radiated in the direction of the radiation exit surface out of the side face of the semiconductor chip facing the radiation exit surface thus cannot impinge on the opening without prior reflection. To establish the electrically conductive connection between the semiconductor chip and the contact, the opening is expediently filled with an electrically conductive material, for example, a metal.

The radiation-guiding layer may be arranged in the vertical direction between the semiconductor chip and the reflector body. Radiation radiated through the front side of the semiconductor chip is thus coupled into the radiation-guiding layer. With the reflector body, the radiation radiated in the vertical direction from the semiconductor chip is deflected in the direction of the radiation exit surface. In the vertical direction the radiation exit surface, seen from the mounting surface, is above the semiconductor chip. This example is suitable in particular for semiconductor chips formed as surface emitters, that is to say for semiconductor chips in which only a small content, for example, at most 30%, of the radiation exits laterally. In this example, the vertical extension of the radiation exit surface can be adjusted during production by the vertical extension of the radiation-guiding layer independently of the vertical extension of the semiconductor chip.

In one example, the reflector body runs completely around the semiconductor chip in the lateral direction. By the reflector body a lateral radiation from the semiconductor chip is thus avoided so that a coupling into the radiation-guiding layer takes place completely or at least to the extent of 80% or more through the front side of the semiconductor chip.

Alternatively, the radiation-guiding layer completely or at least partially covers both the front side of the semiconductor chip and at least one side face, in particular all side faces, of the semiconductor chip. The radiation coupling into the radiation-guiding layer can thus take place over a comparatively large surface area of the semiconductor chip.

The semiconductor chip may have a mirror layer on at least two outer surfaces. In particular, the semiconductor chip can be provided with a mirror layer on all outer surfaces, apart from on the side face facing the radiation exit surface. The mirror layer can be formed, for example, by a metal layer and/or by a dielectric mirror structure, for example, a Bragg mirror. With the mirror layer, the places on the semiconductor chip at which a radiation decoupling is to be avoided can be defined.

The semiconductor chip may be arranged on a lead frame. The lead frame forms in particular at least one contact to electrically contact the semiconductor component.

The contact may be formed by a coating on the semiconductor chip. Compared to a lead frame, such a coating can be distinguished by a lower thickness so that the installation height of the semiconductor component is reduced further. In particular, the contact and the reflector body end flush with one another in the vertical direction on the mounting surface.

In a method of producing a plurality of radiation-emitting semiconductor components, a plurality of semiconductor chips may be provided, each having a semiconductor layer sequence having an active region that produces radiation. For example, the semiconductor chips are positioned in matrix form, for example, on an auxiliary carrier or on a lead frame composite. A radiation-guiding layer is formed adjacent to the semiconductor chips. A reflector material is molded around the radiation-guiding layer is at least in regions to form a reflector body. Singulation into the radiation-emitting semiconductor components subsequently takes place, wherein each semiconductor component has at least one semiconductor chip and wherein during singulation the radiation-guiding layer and the reflector body are severed such that the radiation-guiding layer forms a radiation exit surface of the singulated semiconductor components.

Formation of the reflector body and/or formation of the radiation-guiding layer can be carried out, for example, by casting, wherein casting generally describes methods of applying a molding composition and in particular also includes injection molding, transfer molding and compression molding.

The radiation-guiding layer may be completely surrounded in the lateral direction by the reflector body before singulation and is exposed during singulation. During singulation, a side face of the component on which the radiation-guiding layer is exposed is thus formed. At the side face on which the radiation exit surface is formed the reflector body and the radiation-guiding layer end flush.

Singulation can be carried out, for example, mechanically, for example, by sawing or cutting, chemically, for example, by etching, or by a treatment with coherent radiation, for example, with a laser.

The side faces of the singulated semiconductor components, in particular the radiation exit surface, can therefore show traces of the singulation step, for example, traces of a mechanical or chemical treatment or of an action of laser radiation.

Separating trenches may be formed in the radiation-guiding layer before molding with the reflector material. In particular, the radiation-guiding layer is divided by the separating trenches into a number of segments corresponding to the number of semiconductor components to be produced. The side faces of the radiation-guiding layer are thus formed during formation of the separating trenches. In particular, during molding around the radiation-guiding layer the reflector material is formed on to the side faces of the radiation-guiding layer formed during formation of the separating trenches. In deviation from this, the individual segments of the radiation-guiding layer can also already be formed during formation of the radiation-guiding layer, for example, by a correspondingly formed casting mold.

Before the molding around the radiation-guiding layer, the individual segments of the radiation-guiding layer, each having at least one semiconductor chip, are arranged in a new grid so that the distance between the individual segments of the radiation-guiding layer during molding around the reflector material is greater than the width of the separating trench.

The semiconductor chips may be contacted electrically after formation of the radiation-guiding layer. For example, contact tracks are formed, which run on the semiconductor chips in regions and on the radiation-guiding layer in regions. In particular, contacting the semiconductor chips is carried out between formation of the radiation-guiding layer and formation of the reflector body.

The semiconductor chips may be contacted electrically through openings in the radiation-guiding layer. The openings can be formed already during formation of the radiation-guiding layer or by a subsequent removal of material of the radiation-guiding layer, for example, by a laser.

The radiation-guiding layer may be formed on to the side faces of the semiconductor chips during formation of the radiation-guiding layer. The radiation-guiding layer is thus adjacent to the side faces of the semiconductor chips.

The side faces of the semiconductor layer may be provided with a further reflector material before formation of the radiation-guiding layer. In this case, the further reflector material is adjacent to the side faces of the semiconductor chips and prevents a lateral exit of radiation from the semiconductor chips. The terms "reflector material" and "further reflector material" do not imply a sequence with respect to the sequence of these steps in carrying out the method. The reflector material and the further reflector material can be the same or different to one another with respect to the material.

The radiation-guiding layer may comprise a radiation-converting material, and a color locus of the radiation radiated by the semiconductor component is established, after singulation into the radiation-emitting semiconductor components by removal of material from the radiation-guiding layer. Removal of material can take place uniformly over the entire area of the radiation exit surface or only in places, for example, by local notching.

A distance between the semiconductor chip and the radiation exit surface is preferably 50 µm to 500 µm. The smaller the distance, the lower the absorption losses can be during reflection of the radiation at the reflector body. On the other hand, variations in the distance due to, for example, production-related variations in positioning of the singulation cut relative to the semiconductor chips can lead to variations in color locus, small deviations in the production having a greater percentage effect with small distances than with larger distances. A distance of 50 µm to 500 µm has proved to be particularly suitable. In particular, we found that, for example, a color locus in the CIE diagram with the coordinates cx=0.29 and cy=0.27 can be achieved in this way. This color locus corresponds to a color temperature of about 8,500 K. However, the color locus does not lie on the curve of a black emitter.

The method described is particularly suitable to produce a radiation-emitting semiconductor component described above. Features described in connection with the semiconductor component can therefore also be used for the method and vice versa.

Further features and practicalities emerge from the following description of the examples in combination with the figures.

Elements which are the same, similar or have the same action are provided with the same reference symbols in the figures.

The figures and the size ratios of the elements shown in the figures with respect to one another are not to be regarded as to scale. Rather, individual elements and in particular layer thicknesses may be shown in exaggerated size for better representability and/or better understanding.

A first example of a semiconductor component is shown in FIGS. 1A to 1D. The semiconductor component 1 extends in a vertical direction between a mounting surface 11 and a front side 13. Between the mounting surface and the front side run side faces 12 which delimit the semiconductor component 1 in the lateral direction. The side faces run perpendicularly or at least substantially perpendicularly to the mounting surface. A radiation exit surface 10 is formed on one of the side faces 12. The main radiation direction of the radiation radiated by the semiconductor component runs perpendicularly to the radiation exit surface and parallel to the mounting surface.

The semiconductor component 1 comprises by way of example two semiconductor chips 2 that produce radiation. The semiconductor chips extend in the vertical direction between a rear side 23 and a front side 24. In the lateral direction the semiconductor chips are delimited by side faces 27. The semiconductor chips 2 have on the front side 24 in each case a first connection land 25 and a second connection land 26. The semiconductor chips 2 have a rectangular, non-square, base surface. Parallel to the radiation exit surface the extension of the semiconductor chips is preferably at least 20% greater than in a direction running perpendicularly to the radiation exit surface. An increased radiation decoupling in the direction of the radiation exit surface can thus be delivered compared to semiconductor chips of square base surface. In deviation from this, however, semiconductor chips of square base surface can also be used. Details of the semiconductor chips, in particular of the active region that produces radiation, are not shown in FIGS. 1A to 1D, in particular in the section view in FIG. 1B along the line AA', for simplified representation. The semiconductor chip can be configured, for example, as described below in connection with FIG. 2B.

On the mounting surface 11 the semiconductor component 1 has a first contact 51 and a second contact 52. The first contact 51 connects electrically conductively with the first connection land 25 and the second contact 52 with the second connection land 26. By applying an external electrical voltage between the first and the second contact, charge carriers can be injected from different sides into the active region of the semiconductor chip and can recombine there with emission of radiation.

The semiconductor component 1 furthermore comprises a radiation-guiding layer 3. The radiation-guiding layer is adjacent to the semiconductor chips 2 along the entire circumference. The radiation-guiding layer is formed, for example, by a molding composition formed on to the semiconductor chips 2 during production. The radiation-guiding layer 3 is adjacent to the semiconductor chips 2 and forms the radiation exit surface 10. Radiation produced in the semiconductor chip 2 during operation and decoupled through a side face 27 can be decoupled directly from the semiconductor component 1 via the radiation-guiding layer 3, without passing through a further interface. On the side facing the mounting surface 11 the radiation-guiding layer 3 and the semiconductor chip 2 end flush.

The semiconductor component 1 furthermore comprises a reflector body 4. As can be seen in the perspective representation in FIG. 1C, in a side view of the semiconductor component the reflector body 4 runs around the radiation-guiding layer 3 along the entire circumference. The reflector body 4 thus forms a frame around the radiation-guiding layer 3. In a top view of the semiconductor component 1 the reflector body 4 covers the semiconductor chips 2 completely. By the reflector body, radiation being decoupled through the front side 13 of the semiconductor component 1 is thus avoided.

The reflector body 4 forms the mounting surface 11 of the semiconductor component in regions. Furthermore, the reflector body forms the front side 13 and the side faces 12 completely or at least in regions. The reflector body 4 thus forms all outer surfaces of the semiconductor component at least partially.

The reflector body 4 preferably has a reflectivity for the radiation produced in the semiconductor chip 2 of at least 80%, particularly preferably of at least 90%. For example, a polymer material such as silicone filled with reflecting particles, for example, titanium oxide particles is suitable for the reflector layer.

The radiation-guiding layer 3 comprises a radiation-converting material that converts primary radiation produced in the semiconductor chip 2 completely or at least partially into secondary radiation. For example, the semiconductor chip and the radiation-converting material can be formed such that the semiconductor component emits in total radiation in the red, green and blue spectral range. Such a semiconductor component is particularly suitable for a back-lighting unit for a display apparatus, for example, a liquid crystal display.

Depending on the use of the semiconductor component 1, however, it is also possible for the radiation-guiding layer 3 to be free from radiation-converting material and for the semiconductor component to emit only the primary radiation produced in the semiconductor chip 2, for example, primary radiation in the blue spectral range.

In the radiation-guiding layer 3, openings 31 are formed which extend in the vertical direction completely through the radiation-guiding layer. Through these openings, the connection lands 25, 26 of the semiconductor chips 2 electrically conductively connect with the particular assigned contacts 51, 52. In a top view of the semiconductor component, the openings 31 are arranged such that the beam path between the side face of the semiconductor chips 2 facing the radiation exit surface 10 and the radiation exit surface is free from the openings. The risk of a shadowing of the radiation exit surface by the opening is avoided in this way. Alternatively, to openings through the radiation-guiding layer, the electrical contacting can also take place in the reflector body 4. This is explained in more detail in connection with FIG. 2B.

On the radiation-guiding layer 3 are formed contact tracks 55 which in a top view of the semiconductor component extend from the connection lands 25, 26 of the semiconductor chips to the openings 31. The contact tracks are arranged between the radiation-guiding layer and the reflector body 4 and therefore cannot be seen in a top view of the semiconductor component.

In the example shown, the radiation decoupling from the semiconductor chips takes place in particular via the side faces 27. A semiconductor chip formed as a volume emitter is therefore suitable in particular for the semiconductor chip. In a volume emitter the radiation decoupling also takes place via the side faces of the semiconductor chip, for example, through the side faces of the growth substrate for the semiconductor layer sequence of the semiconductor chip.

The contacts 51, 52 are formed as a coating on the semiconductor chips 2. Preferably, the contacts have a thickness of at least 10 µm, particularly preferably a thickness of at least 25 µm. It is thus ensured that the part of the reflector body 4 arranged laterally to the contacts is sufficiently thick to deflect radiation radiated in the direction of the mounting surface 11. Alternatively, it is possible to provide a mirror coating on the part of the mounting surface to improve efficiency. The contacts can also have a smaller thickness.

The vertical extension of the radiation-guiding layer 3 corresponds substantially to the vertical extension of the semiconductor chips 2. The total installation height of the semiconductor component results from addition of the vertical extension of the radiation-guiding layer 3 and the vertical extensions of the reflector body 4 above and below the radiation-guiding layer. With this construction particularly small installation heights can be achieved. Furthermore, such a semiconductor component is particularly suitable for lateral coupling into comparatively thin light guides. Preferably, the semiconductor component 1 has an installation height, that is to say a vertical extension, of at most 500 µm, preferably 100 µm to 300 µm, for example, 200 µm.

The example shown in FIG. 2A in a top view and in an associated section view along the line BB' in FIG. 2B substantially corresponds to the first example described in connection with FIGS. 1A to 1D. In contrast to this, the radiation-guiding layer 3 is arranged in the vertical direction between the semiconductor chips 2 and the front side 13 of the semiconductor component 1. The radiation coupling into the radiation-guiding layer thus takes place through the front side 24 of the semiconductor chip 2.

The reflector body 4 in this example is formed by a part body 42 and a further part body 43. During production of the semiconductor component the part body and the further part body are each formed by a reflector material, for example, by casting. The part body and the further part body can be configured the same or differently to one another with respect to the material. The part body 42 runs completely around the semiconductor chips 2 in the lateral direction. A lateral radiation decoupling from the semiconductor chips is thus avoided by the part body 42. The further part body 43 is arranged on the side of the part body 42 facing away from the mounting surface 11. In the vertical direction the radiation-guiding layer 3 thus runs between two part bodies of the reflector body in regions. In a side view the reflector body 4 formed by the part body 42 and the further part body 43 runs around the radiation exit surface formed by the radiation-guiding layer 3 in a frame-like manner as described in connection with FIG. 1C.

In the part body 42 openings 41 are formed, through which the semiconductor chip 2 electrically conductively connects to the contacts 51, 52. Openings in the radiation-guiding layer are thus not necessary.

Figure 2A:
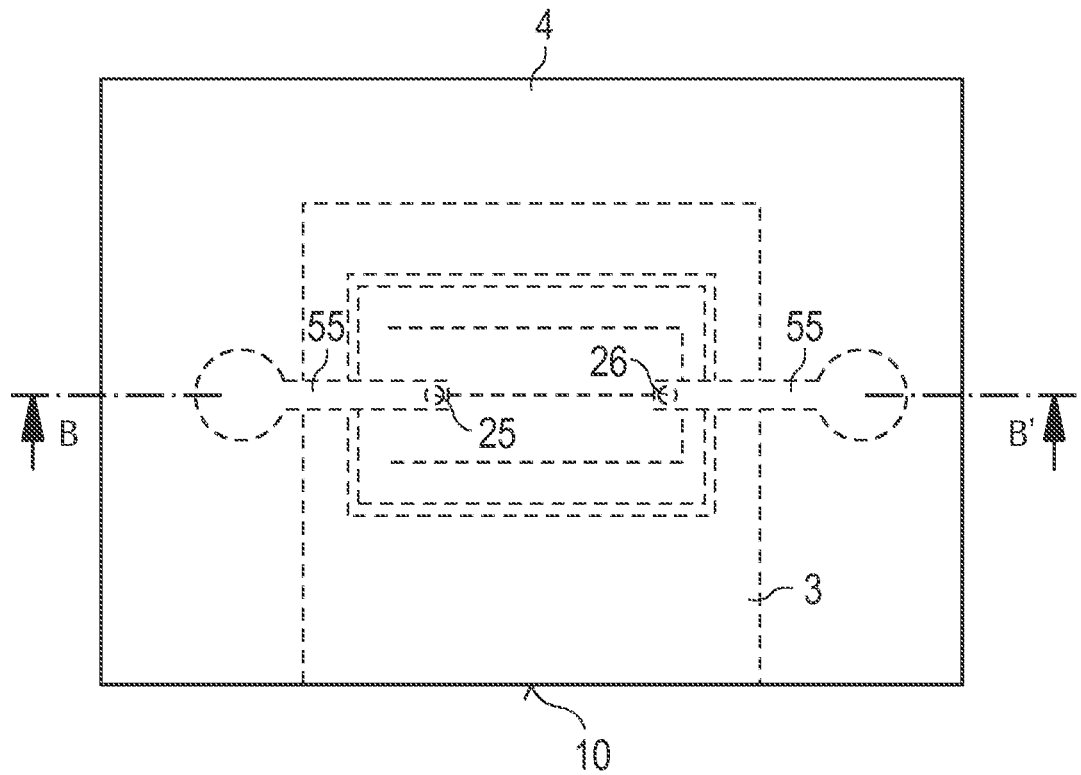
FIGS. 2A, 3A, 4A and 5A each show an example of a semiconductor component in a top view diagram.
Figure 2B:
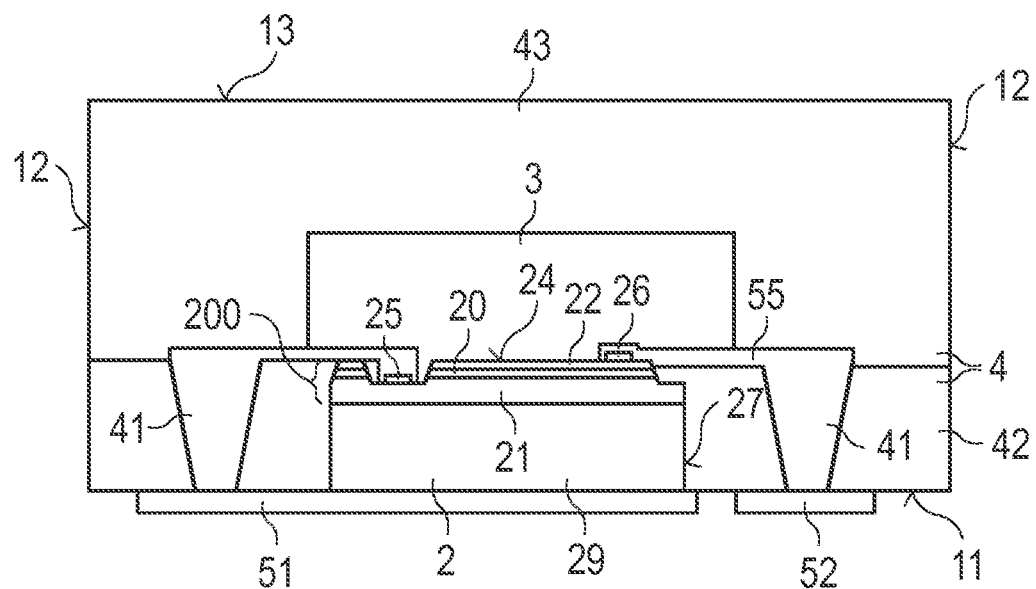
FIGS. 2B, 3B, 4B and 5B each show the associated section view.

The semiconductor chip shown in FIG. 2B is formed as a volume emitter in which a semiconductor layer sequence 200 is arranged on a carrier 29. The carrier is, for example, the growth substrate for the epitaxial deposition of the semiconductor layer sequence 200. The semiconductor layer sequence comprises an active region 20 that produces radiation and is arranged between a first semiconductor layer 21 of a first conduction type, for example, n-conducting and a second semiconductor layer 22 of a second conduction type differing from the first conduction type, for example, p-conducting. The main extension plane of the semiconductor layers of the semiconductor layer sequence runs parallel to the mounting surface 11. For the semiconductor layer sequence 200, for example, a III-V compound semiconductor material is suitable. For nitride compound semiconductor material, in particular $Al_xIn_yGa_{1-x-y}N$ where $0 \leq x \leq 1$, $0 \leq y \leq 1$, $x+y \leq 1$, sapphire or silicon carbide, for example, is suitable as the growth substrate. The radiation decoupling also takes place in particular through the side faces of the carrier 29.

Figure 3A:
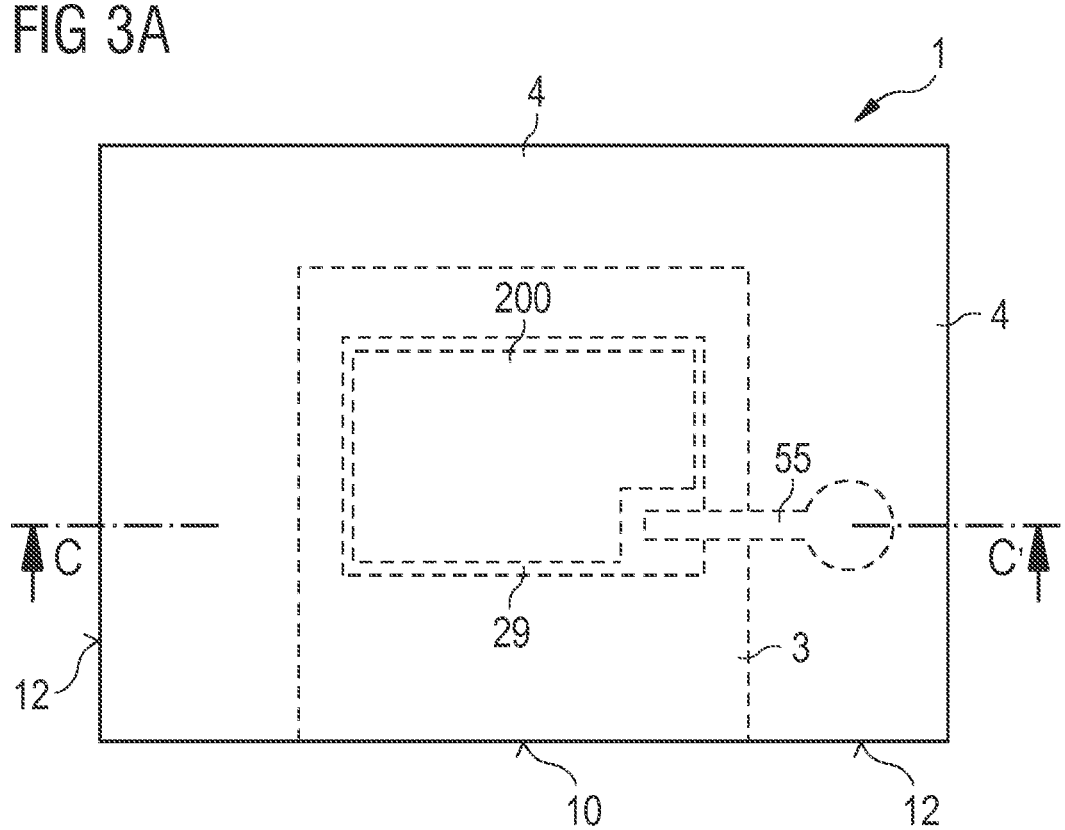
Figure 3B:
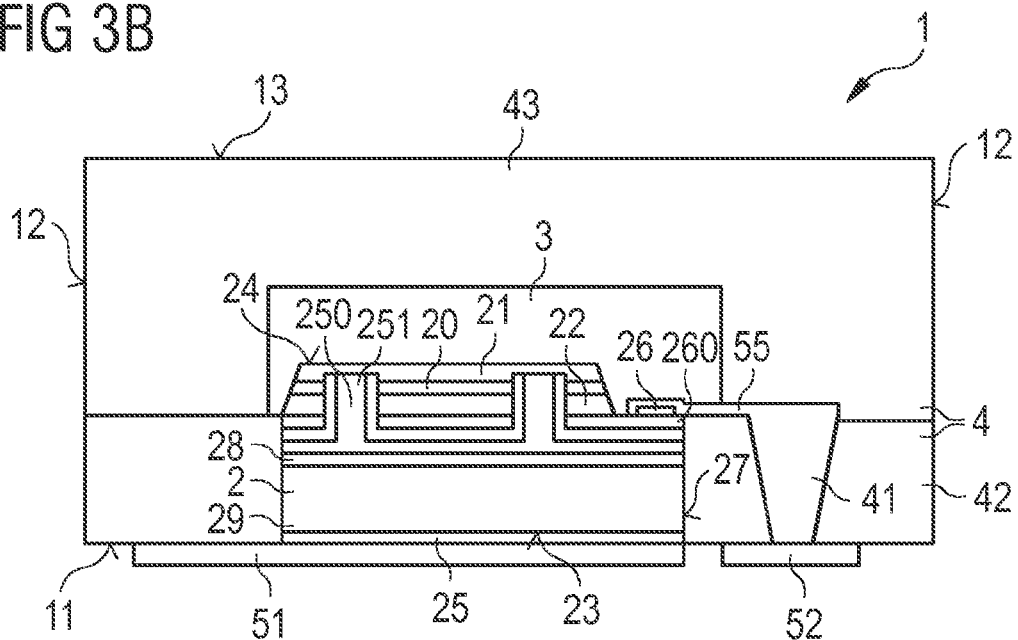

The example shown in FIGS. 3A and 3B in a top view and in an associated section view along the line CC' differs from the example described with the aid of FIGS. 2A and 2B in particular in that the semiconductor chip 2 is formed as a thin film semiconductor chip. The carrier 29 differs from the growth substrate for the semiconductor layer sequence. The semiconductor layer sequence 200 is fastened to the carrier 29 by a bonding layer 28, for example, a solder layer or an electrically conductive adhesive layer.

The semiconductor chip has on the rear side 23 the first connection land 25 and on the front side 24 the second connection land 26. The electrical contacting thus takes place through the carrier 29. The second semiconductor layer 22 electrically conductively connects to the second connection land 26 via a second connection layer 260. The second connection layer serves as a mirror layer for the radiation produced in the active region 20. Such a thin film semiconductor chip represents a surface emitter in a good approximation. In the semiconductor layer sequence 200 are formed recesses 251 extending from the side facing the carrier 29 through the second semiconductor layer 22 and the active region 20 into the first semiconductor layer 21. In these recesses the first semiconductor layer 21 electrically conductively connects to a first connection layer 250. The second connection layer runs between the first connection layer and the semiconductor layer sequence in some places. The second connection land 26 is arranged laterally to the semiconductor layer sequence 200 so that a shadowing of the active region 20 can be avoided.

In deviation from the example described, the semiconductor chip 2 can also be formed such that the first connection land 25 and the second connection land 26 are arranged on the front side 24 of the semiconductor chip, in particular laterally to the semiconductor layer sequence 200.

Figure 4A:
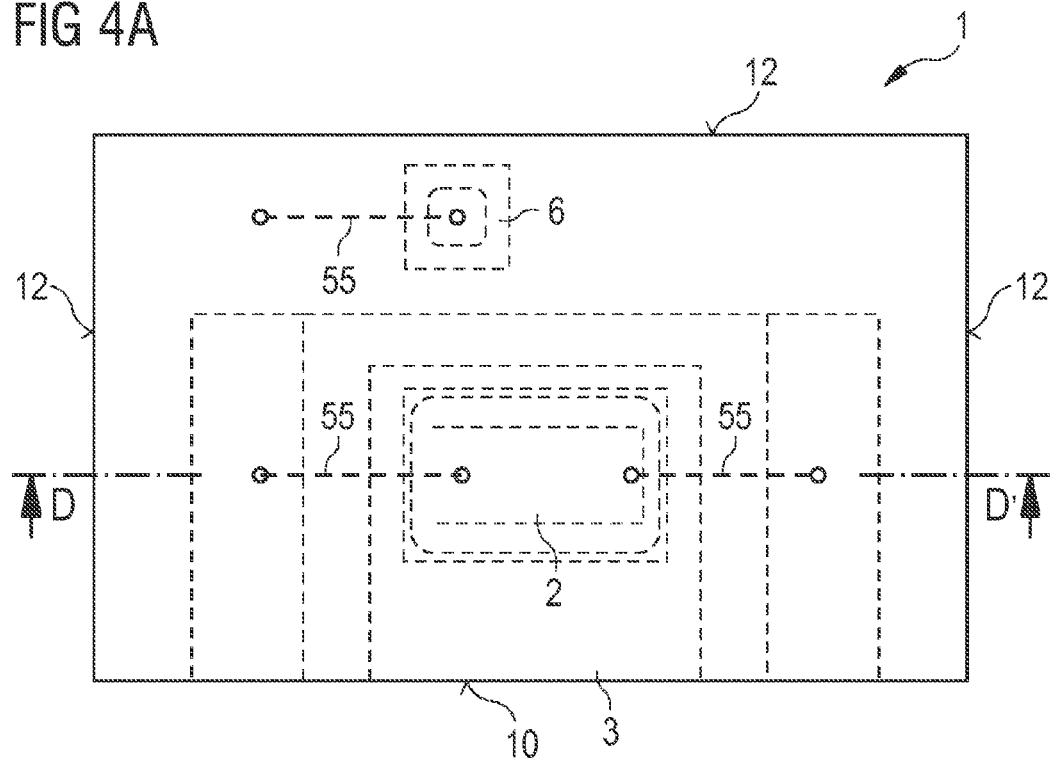
Figure 4B:
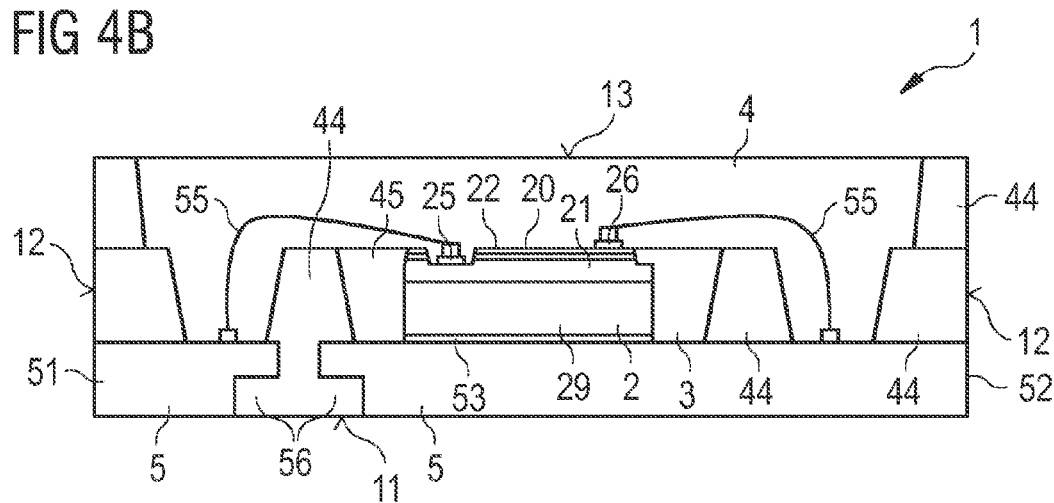

The example shown in FIGS. 4A and 4B in a top view and in an associated section view along the line DD' substantially corresponds to the first example described in connection with FIGS. 1A to 1D. In contrast to this, the semiconductor chip 2 is arranged on a lead frame 5 and fastened to the lead frame by a fastening layer 53, for example, a solder layer or an electrically conductive adhesive layer. The lead frame 5 forms the first contact 51 and the second contact 52. Adjacent to the lead frame 5 is a housing layer 44 in regions.

The housing layer 44 connects the first contact 51 and the second contact 52 to one another in a mechanically stable manner. The housing layer 44 forms a cavity 45 in which the semiconductor chip 2 is arranged. The radiation-guiding layer 3 is arranged in the cavity. During production of the semiconductor component 1 the cavity is filled at least partially with the material of the radiation-guiding layer 3.

To improve the mechanical stability, the lead frame 5 has an undercut 56. The interlocking between the housing layer 44 and the lead frame 5 is thereby increased.

The lead frame 5 can be provided with a coating to increase reflectivity, for example, a silver coating. By using a lead frame, removal of heat from the semiconductor chip 2 is furthermore improved. However, the lead frame also leads to a greater installation height of the semiconductor component.

The housing layer 44 is formed by a reflecting molding composition. The contact tracks 55 in this example are formed as bond wires connecting the connection lands 25, 26 of the semiconductor chip 2 electrically conductively to the first contact 51 and, respectively, the second contact 52. The reflector body 4 is formed on the side of the radiation-guiding layer 3 facing away from the mounting surface 11. The contact tracks 55 run within the reflector body 4.

Furthermore, the semiconductor component 1 comprises an electrical component 6. The electrical component is, for example, formed as an ESD protection element, for example, as a Zener diode and protects the semiconductor chip from electrostatic discharge. The electronic component 6 is embedded in the reflector body 4.

Figure 5A:
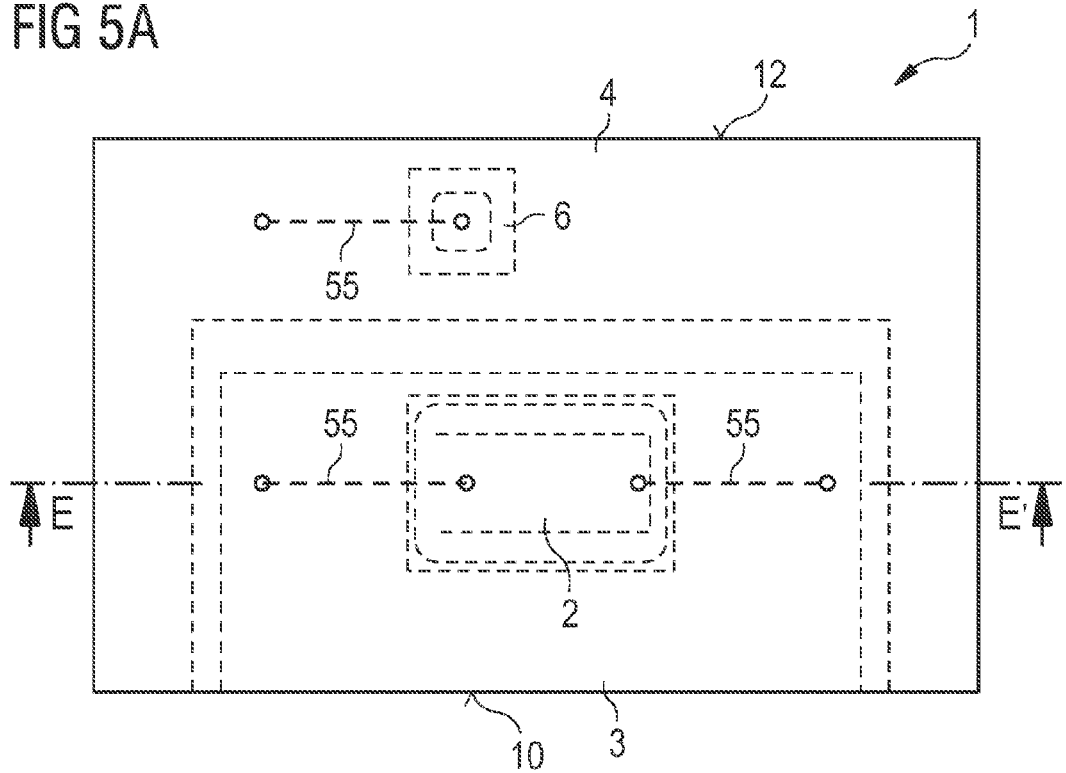
Figure 5B:
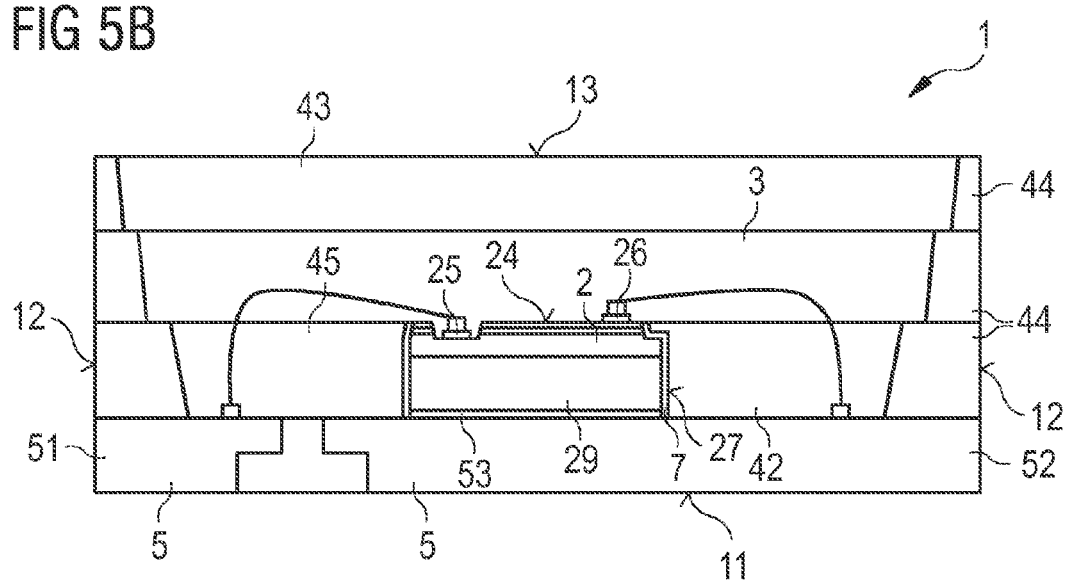

The example shown in FIGS. 5A and 5B in a top view and in an associated section view along the line EE' differs from the example shown in FIGS. 4A and 4B in particular in that the radiation-guiding layer 3 as described in connection with FIGS. 2A and 2B is arranged in the vertical direction between the semiconductor chip 2 and the front side 13 of the semiconductor component. The radiation coupling into the radiation-guiding layer 3 thus takes place only via the front side 24 of the semiconductor chip. To avoid a lateral decoupling from the semiconductor chip, the side faces 27 of the semiconductor chip are provided with a reflecting coating 7. For the coating 7 a metallic layer or a dielectric mirror structure, for example, are suitable. In the examples described above, such a coating can also be formed on the outer surfaces of the semiconductor chip 2, through which no radiation is to exit. In this example, a thin film semiconductor chip is of course also suitable (compare FIG. 3B).

An example of a method of producing a radiation-emitting semiconductor component is shown in FIGS. 6A to 6J, wherein by way of example a semiconductor component configured as described in connection with FIGS. 1A to 1D is produced.

Figure 6A:
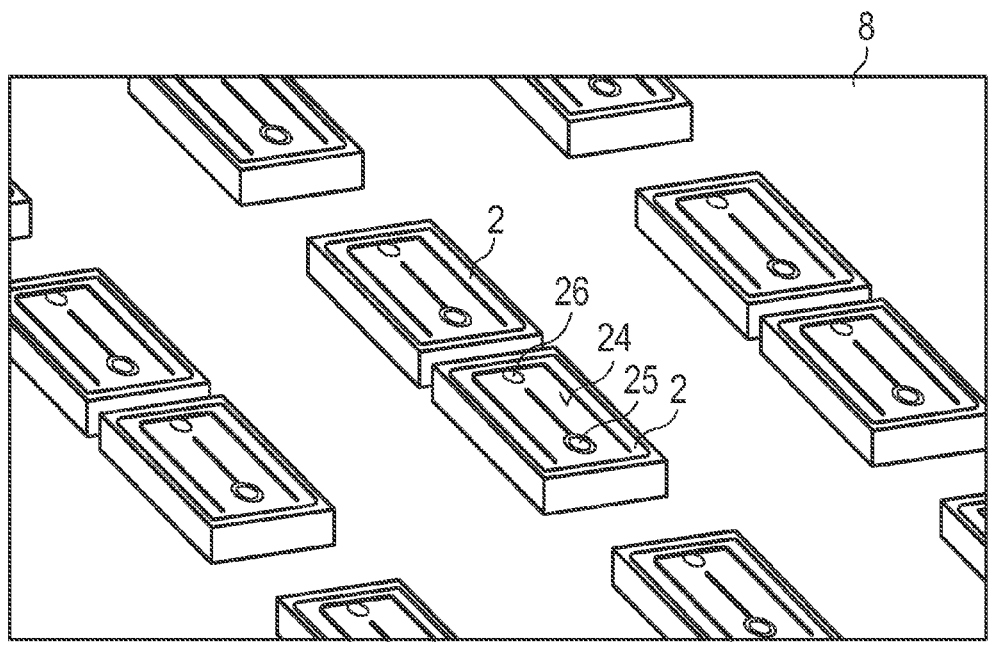
FIGS. 6A to 6J show an example of a method of producing a semiconductor component with the aid of intermediate steps shown in diagram in various perspectives.

The semiconductor chips 2 that produce radiation are positioned on an auxiliary carrier 8 (FIG. 6A). A temporary rigid carrier or a film, for example, is suitable as the auxiliary carrier. The description is given by way of example for a semiconductor component having two semiconductor chips. However, the semiconductor component can also have only one semiconductor chip or more than two semiconductor chips. Furthermore, one semiconductor chip can also have several emission regions, in particular spaced laterally from one another, which at least partially electrically connect in series. Such a semiconductor chip can be operated at relatively high operating voltages. For example, a semiconductor chip with twice the length and at least two emission regions can replace an arrangement having two semiconductor chips arranged side by side. By this method the number of connection lands required is reduced, which can lead to a reduced absorption of radiation.

The semiconductor chips can furthermore have on the front side and/or on the rear side a reflecting coating. The side faces of the semiconductor chips can also have such a coating, apart from the side face which in the finished semiconductor component is facing the radiation exit surface.

Figure 6B:
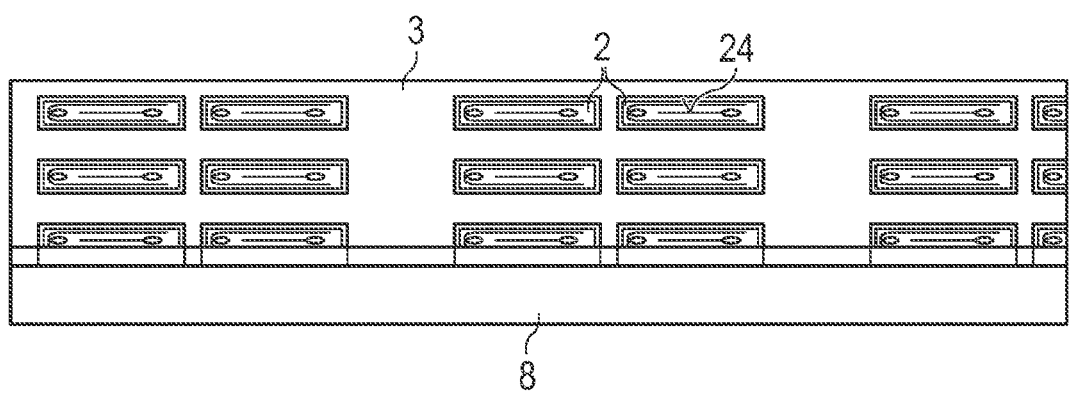

The semiconductor chips are subsequently molded as shown in FIG. 6B in perspective section view with a molding composition, for example, a silicone to which radiation-converting material is added, to form a radiation-guiding layer 3. The front side 24 of the semiconductor chips 2 remains at least partially free from material of the radiation-guiding layer so that the connection lands 25, 26 are accessible for the electrical contacting of the semiconductor chips. The rear side 23 facing the auxiliary carrier 8 likewise remains free from the molding composition.

Figure 6C:
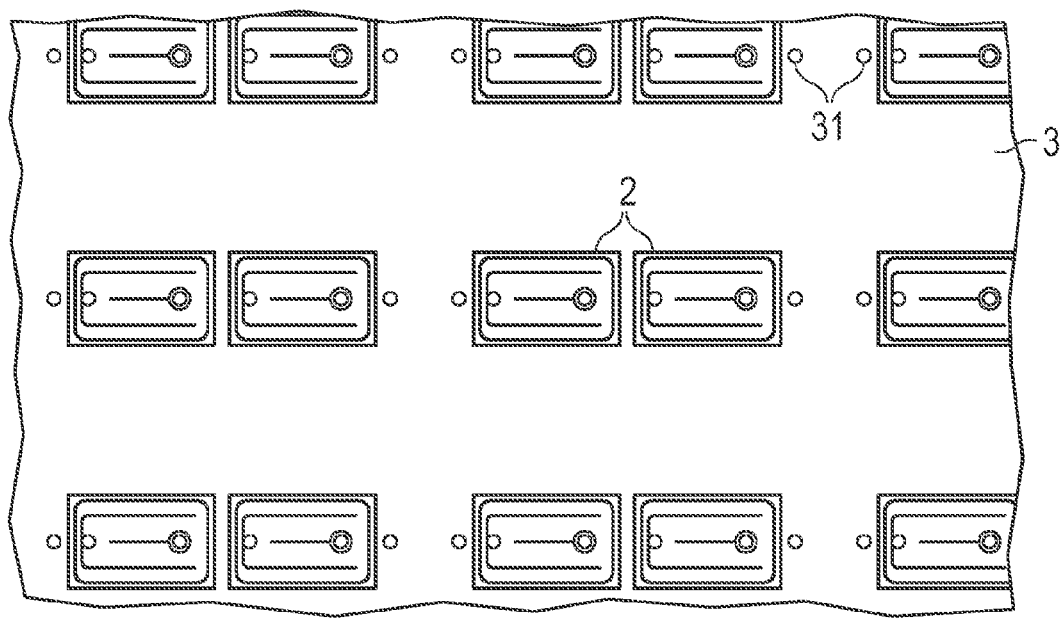

In the radiation-guiding layer 3, as shown in FIG. 6C, openings 31 are formed, for example, by a laser or by an etching method. In deviation from this the radiation-guiding layer 3 can also already be formed such that it has the openings, for example, by a suitable molding tool for the casting method.

Figure 6D:
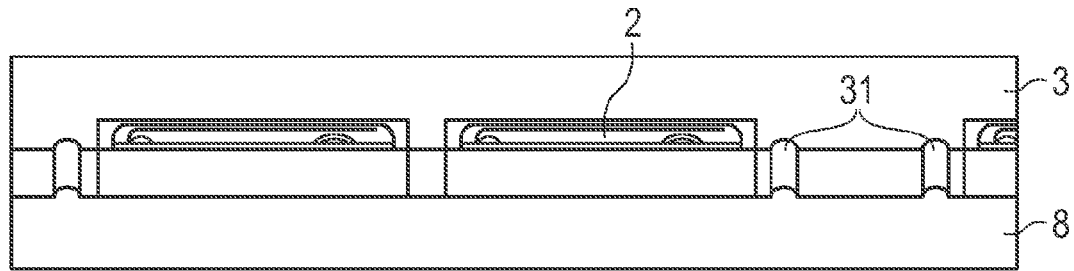
Figure 6E:
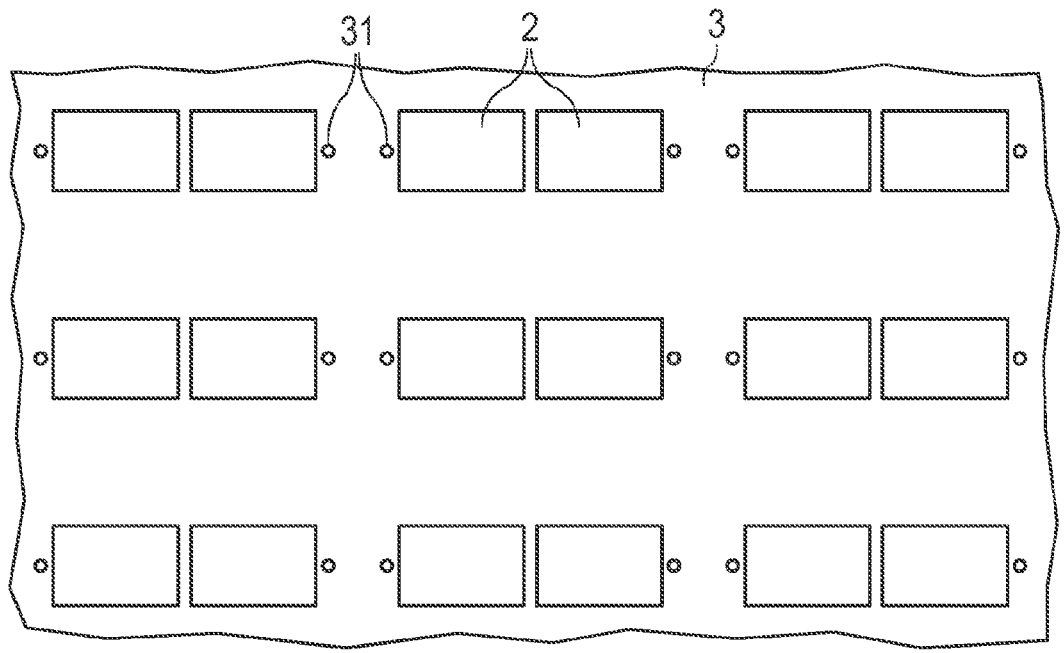

An associated perspective section view in which a section through the openings 31 can be seen is shown in FIG. 6D. A rear view of this method stage is shown in FIG. 6E.

Figure 6F:
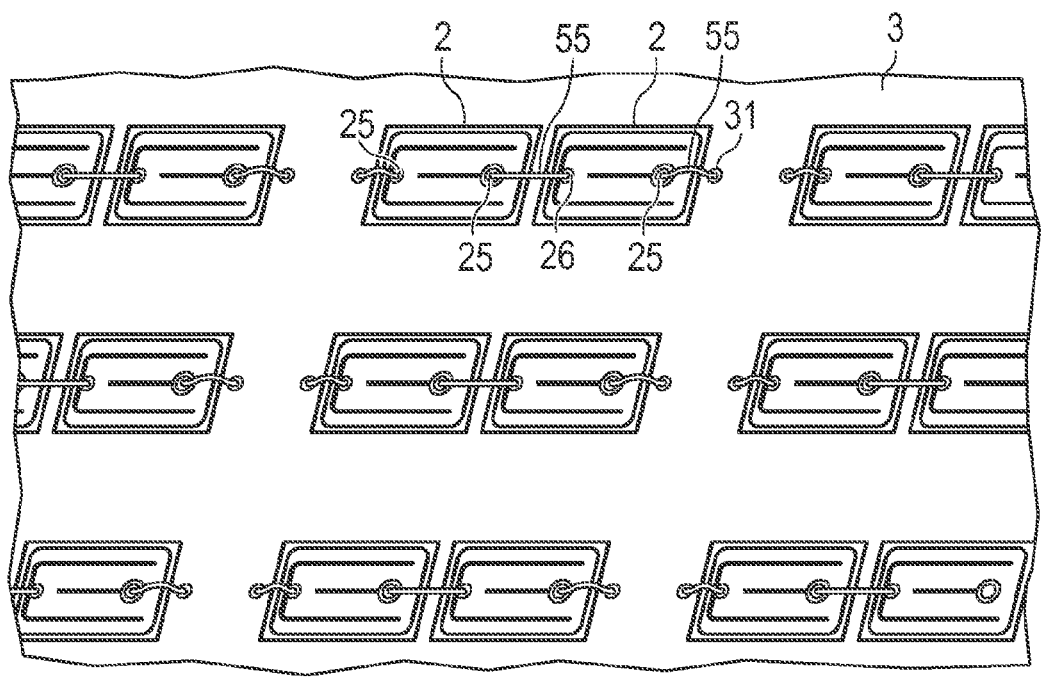

Subsequently, as shown in FIG. 6F, contact tracks 55 are formed to establish an electrically conductive connection between the connection lands 25, 26 of the semiconductor chips and the associated openings 31. In the example shown, the semiconductor chips 2 each belonging to a semiconductor component electrically connect to one another in series.

For formation of the contact tracks 55, a seed layer can be deposited over the entire area, for example, by sputtering and, subsequently, thickened in some places, for example, galvanically. The regions not to be thickened can be covered by a protective lacquer. After removal of the protective lacquer the non-thickened regions of the seed layer can be removed.

Figure 6G:
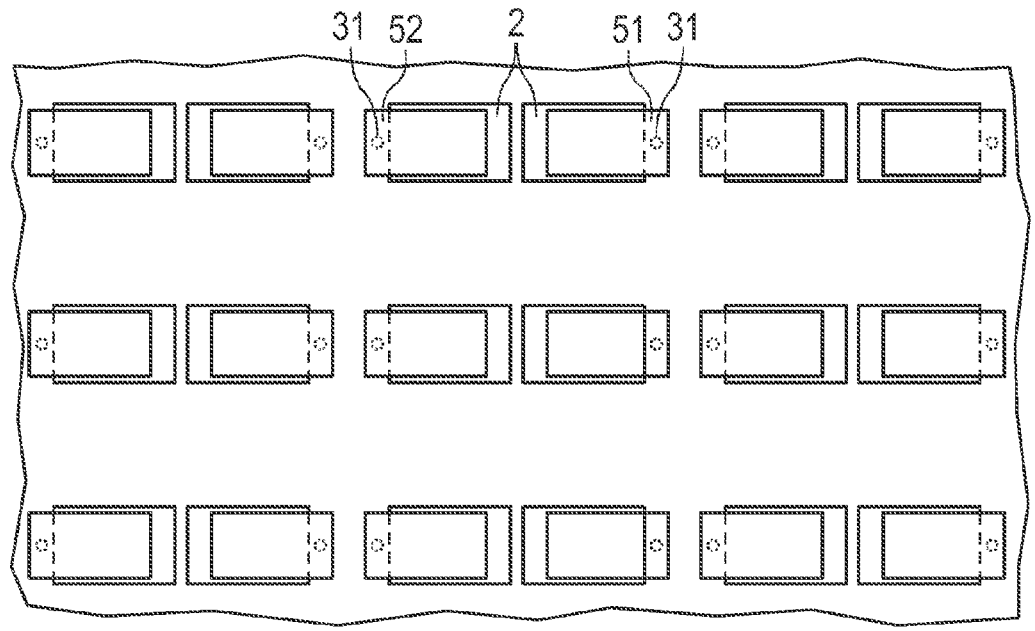

As shown in FIG. 6G, the first contacts 51 and second contacts 52 are applied to the rear side of the later semiconductor component. The contacts overlap in each case with a semiconductor chip and with an opening 31.

The radiation-guiding layer 3 can optionally be provided with a reflecting coating on the front side and/or on the rear side. For electrical insulation between the coating and the contacts or the contact tracks, these can be left free during the coating. Alternatively, an electrical insulation can be effected by an insulating layer. By such a coating the optical and thermal properties of the semiconductor components can be improved.

Figure 6H:
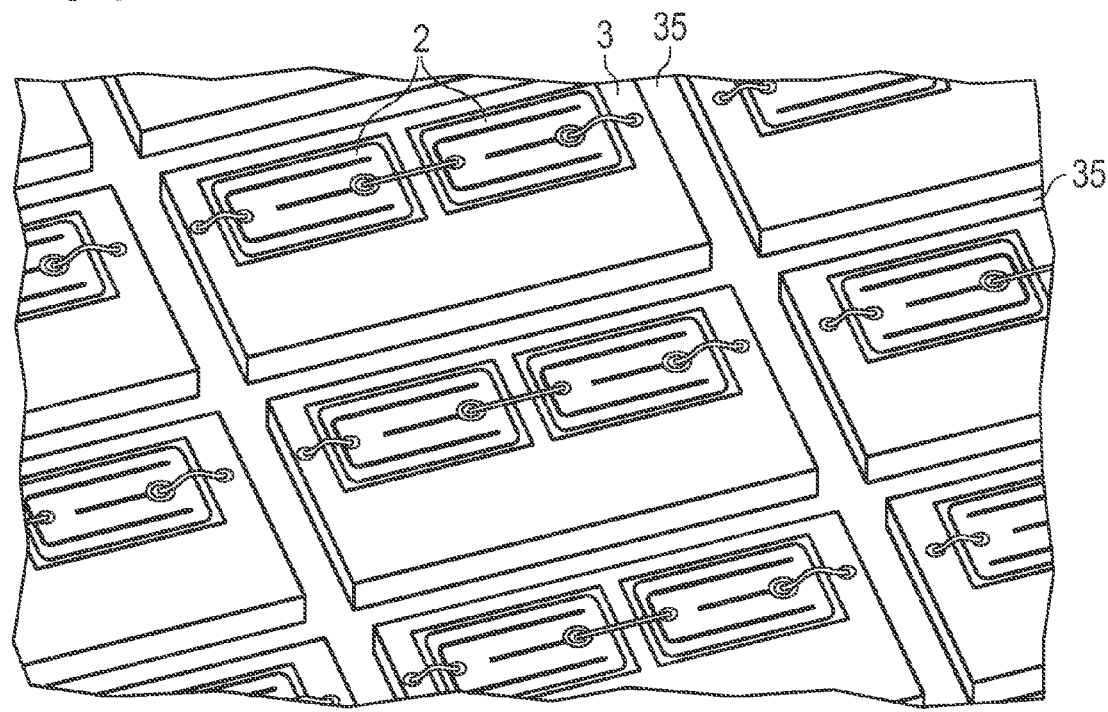

Between the semiconductor chips which belong to different semiconductor components after the later singulation separating trenches 35 are each formed, which divide the radiation-guiding layer 3 into individual segments spaced from one another. The separating trenches run along two directions perpendicular to one another (FIG. 6H).

Figure 6I:
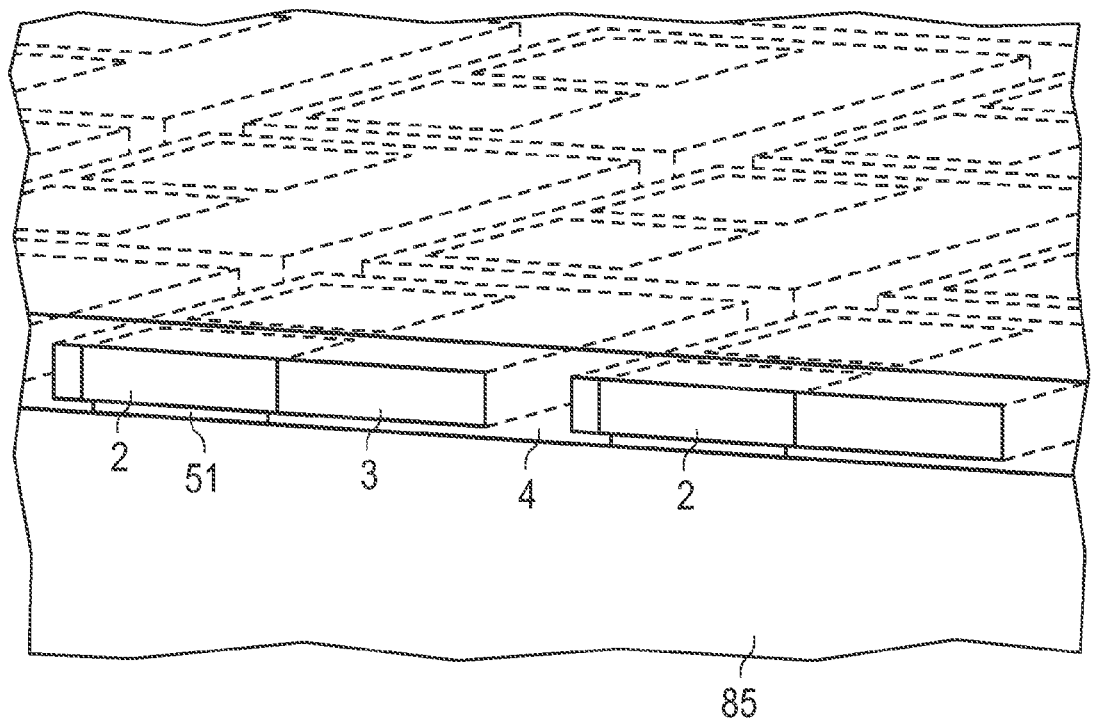

The individual segments of the radiation-guiding layer 3 can now be positioned in a new grid scale on a further auxiliary carrier 85, for example, in matrix form. On the auxiliary carrier 85 the individual segments of the radiation-guiding layer 3 are molded with a molding composition, for example, a silicone filled with titanium oxide particles, for formation of the reflector body 4 (FIG. 6I).

The molding composition thereby also fills the intermediate spaces formed laterally to the contacts 51, 52 between the radiation-guiding layer 3 and the auxiliary carrier 85. In the lateral direction the individual segments of the radiation-guiding layer 3 are surrounded completely by the material of the reflector body 4.

Figure 6J:
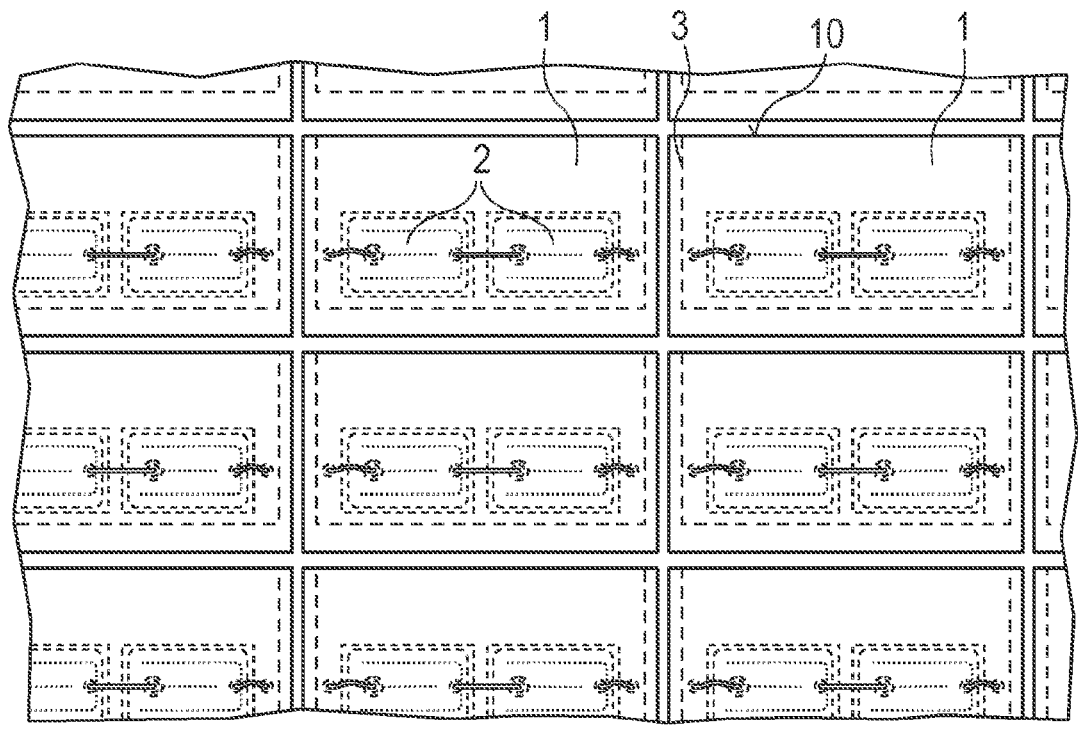

Finally, the reflector body 4, as shown in FIG. 6J, is severed in a singulation step such that the individual semiconductor components are formed. In the singulation step the previously trenched radiation-guiding layer 3 is exposed on exactly one side face of the semiconductor component so that during singulation the radiation exit surface 10 is formed. Perpendicularly to the radiation exit surface, the singulation cuts run completely within the reflector body.

The singulation into semiconductor components (FIG. 6J) and formation of the separating trenches 35 can take place mechanically (for example, by sawing), chemically (for example, by etching) or by coherent radiation (for example, in a laser separating process).

With the method described, semiconductor components in which the radiation exit surface runs at an angle to or perpendicularly to the mounting surface of the semiconductor components can be produced in a simple and reliable manner. In particular, the semiconductor components can be distinguished by a particularly small installation height. At the same time the semiconductor components can provide high radiation outputs during operation and are particularly suitable coupling into flat light guides for back-lighting display apparatuses.

In deviation from the example described, the method can also be modified such that the semiconductor chips 2 are first molded in the lateral direction by a reflecting molding composition for formation of a part body of the reflector body 4 before the radiation-guiding layer 3 is formed. By this a semiconductor component configured as described in connection with FIGS. 2A and 2B can be produced.

In a radiation-guiding layer 3 in which a radiation-converting material is embedded, the color locus is determined, inter alia, by the distance between the radiation exit surface 10 and the closest side face 27 of the semiconductor chip to the radiation exit surface 10. To adjust the color locus, from the radiation exit surface 10 material of the radiation-guiding layer can be removed over the entire area or only in regions, for example, by formation of notches. Production-related variations in color locus due to adjustment tolerances during formation of the singulation cuts relative to the semiconductor chips can be compensated in a simple and reliable manner in this way.

This disclosure claims priority of DE 10 2013 104 840.4, the content of which is herewith incorporated by reference.

Our components and methods are not limited by the description with the aid of the examples. Rather, this disclosure includes any novel feature and combination of features, which in particular includes any combination of features in the appended claims, even if the feature or combination itself is not mentioned explicitly in the claims or the examples.

The invention claimed is:

1. A method of producing a plurality of radiation-emitting semiconductor devices comprising:
   a) providing a plurality of semiconductor chips which each have a semiconductor layer sequence having an active region that produces radiation;
   b) forming a radiation-guiding layer adjacent to the semiconductor chips;
   c) molding a reflector material around the radiation-guiding layer at least in regions to form a reflector body; and
   d) singulating into the radiation-emitting semiconductor devices, wherein each semiconductor device has at least one semiconductor chip, and during singulation, the radiation-guiding layer and the reflector body are severed such that the radiation-guiding layer forms a radiation exit surface of the singulated semiconductor devices,
   wherein, before d), the radiation-guiding layer is completely surrounded by the reflector body in the lateral direction, and is exposed in d).

2. The method according to claim 1, wherein, before c), separating trenches are formed in the radiation-guiding layer between adjacent semiconductor chips.

3. The method according to claim 1, wherein the semiconductor chips are electrically contacted after b).

4. The method according to claim 1, wherein the semiconductor chips are electrically contacted through openings in the radiation-guiding layer.

5. The method according to claim 1, wherein, in b), the radiation-guiding layer is formed on to the side faces of the semiconductor chips.

6. The method according to claim 1, wherein the side faces of the semiconductor chips are provided with a further reflector material before formation of the radiation-guiding layer.

7. The method according to claim 1, wherein the radiation-guiding layer comprises a radiation-converting material, and a color locus of the radiation radiated by the semiconductor device is established after d) by removal of material from the radiation-guiding layer.

8. A method of producing a plurality of radiation-emitting semiconductor devices comprising:
   a) providing a plurality of semiconductor chips which each have a semiconductor layer sequence having an active region that produces radiation;
   b) forming a radiation-guiding layer adjacent to the semiconductor chips;
   c) molding a reflector material around the radiation-guiding layer at least in regions to form a reflector body; and
   d) singulating into the radiation-emitting semiconductor devices, wherein each semiconductor device has at least two semiconductor chips and, during singulation, the radiation-guiding layer and the reflector body are severed in a lateral direction such that the radiation-guiding layer forms a radiation exit surface of the singulated semiconductor devices, wherein the side faces of the semiconductor chips are provided with a further reflector material before formation of the radiation-guiding layer.

9. The method according to claim 8, wherein, before d), the radiation-guiding layer is completely surrounded by the reflector body in the lateral direction, and is exposed in d).

* * * * *